(12) United States Patent
Treml et al.

(10) Patent No.: US 11,903,131 B2
(45) Date of Patent: Feb. 13, 2024

(54) HOLDER FOR A BUTTON CELL, ARRANGEMENT COMPRISING A HOLDER, AND METHOD FOR AUTOMATICALLY MOUNTING A HOLDER

(71) Applicant: WÜRTH ELEKTRONIK EISOS GMBH & CO. KG, Waldenburg (DE)

(72) Inventors: Alexander Treml, Erlenbach (DE); Julia Sanwald, Bretten (DE); Stefan Klingler, Michelbach/Bilz (DE)

(73) Assignee: WÜRTH ELEKTRONIK EISOS GMBH & CO. KG, Waldenburg (DE)

( * ) Notice: Subject to any disclaimer, the term of this patent is extended or adjusted under 35 U.S.C. 154(b) by 75 days.

(21) Appl. No.: 17/643,100

(22) Filed: Dec. 7, 2021

(65) Prior Publication Data

US 2022/0192025 A1 Jun. 16, 2022

(30) Foreign Application Priority Data

Dec. 16, 2020 (EP) .................................... 20214694

(51) Int. Cl.
*H05K 1/18* (2006.01)

(52) U.S. Cl.
CPC ..... *H05K 1/181* (2013.01); *H05K 2201/1028* (2013.01); *H05K 2201/10037* (2013.01); *H05K 2201/10462* (2013.01); *H05K 2201/10643* (2013.01)

(58) Field of Classification Search
None
See application file for complete search history.

(56) References Cited

U.S. PATENT DOCUMENTS

| | | | |
|---|---|---|---|
| 5,980,309 A * | 11/1999 | Frantz | H05K 3/301 439/627 |
| 6,087,037 A | 7/2000 | Rieder | |
| 6,579,119 B1 * | 6/2003 | Wu | H01R 11/282 429/100 |

(Continued)

FOREIGN PATENT DOCUMENTS

| | | |
|---|---|---|
| JP | 05-050666 U | 7/1993 |
| JP | H10154493 A | 6/1998 |

(Continued)

OTHER PUBLICATIONS

Office Action for Application No. JP 2021-203337, dated May 16, 2023, 11 pages.

*Primary Examiner* — Krystal Robinson
(74) *Attorney, Agent, or Firm* — Boyle Fredrickson, S.C.

(57) ABSTRACT

The invention relates to a holder for a button cell, wherein the holder is intended to be fastened on a printed circuit board, wherein the holder has at least two first latching arms which protrude from the printed circuit board when the holder is in the mounted state, wherein the button cell is received between the first latching arms when the button cell is in the mounted state, wherein the first latching arms, at one end, are each connected to a main body which has a base area which is connected to the printed circuit board when the holder is in the mounted state, wherein the first latching arms each have at least one first latching lug in order to hold the button cell on the printed circuit board, and wherein the first latching lugs are arranged at a first distance from the base area of the main body.

18 Claims, 11 Drawing Sheets

(56) References Cited

U.S. PATENT DOCUMENTS

| | | | |
|---|---|---|---|
| 6,722,916 B2 | 4/2004 | Buccinna et al. | |
| 7,059,894 B1 * | 6/2006 | Huang | H01R 13/2442 |
| | | | 439/500 |
| 7,175,677 B2 * | 2/2007 | Miller | H01M 10/425 |
| | | | 429/100 |
| 8,057,255 B1 * | 11/2011 | DiSalvo | H01M 10/425 |
| | | | 439/500 |
| 8,673,481 B2 * | 3/2014 | Chen | H01M 50/216 |
| | | | 429/96 |
| 9,263,716 B2 * | 2/2016 | Szoke | H02J 7/0042 |
| 9,959,994 B1 * | 5/2018 | Liu | H01H 13/78 |
| 2006/0240316 A1 | 10/2006 | Martinez | |
| 2008/0102691 A1 * | 5/2008 | Darr | H01M 50/216 |
| | | | 439/500 |
| 2011/0262790 A1 | 10/2011 | Zhu | |
| 2014/0232348 A1 | 8/2014 | Szoke et al. | |
| 2016/0133893 A1 | 5/2016 | Chong | |
| 2018/0198100 A1 | 7/2018 | Blaha et al. | |
| 2020/0196450 A1 | 6/2020 | Nestle et al. | |

FOREIGN PATENT DOCUMENTS

| | | |
|---|---|---|
| JP | 2000133228 A | 5/2000 |
| TW | M387379 U | 8/2010 |

* cited by examiner

HOLDER FOR A BUTTON CELL, ARRANGEMENT COMPRISING A HOLDER, AND METHOD FOR AUTOMATICALLY MOUNTING A HOLDER

FIELD OF THE INVENTION

The invention relates to a holder for a button cell, wherein the holder is intended to be fastened on a printed circuit board. The invention also relates to an arrangement comprising a holder according to the invention and a printed circuit board. The invention furthermore relates to a method for automatically mounting a holder on a printed circuit board.

BACKGROUND

U.S. Pat. No. 6,722,916 B2 discloses an arrangement comprising a holder for a button cell, wherein the holder is placed onto a printed circuit board. The holder is soldered to soldering areas on the printed circuit board. The holder has a generally U-shaped cross section, wherein the generally U-shaped holder is placed onto the printed circuit board such that a button cell is pushed into the generally U-shaped holder parallel in relation to the printed circuit board. The holder has, starting from the U-shaped bracket, three holding arms which push onto a top side of the button cell and push said button cell against the printed circuit board as a result. A second electrical contact is arranged on the printed circuit board within the U-bracket of the holder, the button cell being pushed against said second electrical contact by means of the holding arms. The contact is of circular design with square openings, so that the contact has a waffle iron-like appearance as a result. A button cell has to be pushed into the holder from the side, parallel in relation to the printed circuit board. This is not possible or not readily possible in a fully automatic manner.

SUMMARY

The aim of the invention is to improve a holder for a button cell, an arrangement comprising a holder and a printed circuit board, and also a method for automatically mounting a holder on a printed circuit board.

According to the invention, a holder having the features of claim 1 and an arrangement having the features of claim 13 and a method having the features of claim 17 are provided for this purpose. Advantageous developments of the invention are specified in the dependent claims.

A holder according to the invention for a button cell is intended to be fastened on a printed circuit board and has at least two first latching arms which protrude from the printed circuit board when the holder is in the mounted state, wherein the button cell is received between the first latching arms when the button cell is in the mounted state, wherein the first latching arms, at one end, are each connected to a main body which has a base area which is connected to the printed circuit, board when the holder is in the mounted state, wherein the first latching arms each have at least one first latching lug in order to hold the button cell on the printed circuit board, and wherein the first latching lugs are arranged at a first distance from the base area of the main body.

By means of latching arms protruding from the printed circuit board and latching lugs on the latching arms, a button cell can be easily pushed in between the latching arms manually or by means of a gripper. This is done until the latching lugs snap to a certain extent over the button cell and hold said button cell securely on the printed circuit board as a result. Consequently, the holder is designed such that the button cell can be firstly reliably electrically contacted and at the same time also reliably held on the printed circuit board by simply pushing a button cell into the holder. Therefore, the button cell can be pushed into the holder perpendicularly in relation to the printed circuit board. Fully automatic insertion of the button cell is possible in a simple manner and with process reliability as a result.

In a development of the invention, the holder has at least two second latching arms which protrude from the printed circuit board when the holder is in the mounted state, wherein the button cell is received between the second latching arms when the button cell is in the mounted state, wherein the second latching arms, at one end, are each connected to the main body, wherein the second latching arms each have at least one second latching lug in order to hold a button cell with a different height from the first button cell on the printed circuit board, and wherein the second latching lugs are arranged at a second distance from the base area the main body, wherein the second distance is different from the first distance.

By way of the holder according to the invention, button cells of different heights can be held on the printed circuit board as a result or else two button cells with different heights or the same height can be held one above the other. Depending on whether a button cell with a first height or a button cell with a second height is inserted into the holder, either the first latching lugs or the second latching lugs engage over a top side of the button cell in sections. If, for example, a button cell with a relatively small height is inserted, the second latching lugs hold the button cell on the printed circuit board in the finally mounted state, whereas the first latching lugs are free and are not actually required. If a button cell of a first, relatively large height is inserted, the second latching lugs with the second latching arms are deflected, but cannot snap back over the to side of the button cell. Consequently, only the first latching lugs engage over the button cell in sections and the button cell is held on the printed circuit board. The second latching arms with the second latching lugs then only contribute to providing good electrical contact between an outer wall of the button cell and the holder when the holder consists of electrically conductive material. As a result, button cells with different heights can be arranged in one and the same holder in a surprisingly simple manner. If two button cells are arranged one above the other, the second latching lugs for example engage over the first, lower button cell in sections and the first latching lugs engage over the second, upper button cell in sections. This renders it possible to produce the holder according to the invention in very large numbers and in a cost-effective manner as a result. In this case, the holder is suitable for button cells of different heights but of the same radius.

In a development of the invention, the latching arms and the main body are of electrically conductive design.

In this way, the holder can serve as a first electrical contact for the button cell.

In a development of the invention, the latching arms are designed as bent sheet-metal strips.

Firstly, secure electrical contact and secondly a very reliable latching action can be achieved by means of bent sheet-metal strips.

In a development of the invention, the holder is designed as a one-piece stamped and bent sheet-metal part.

In this way, the entire holder is electrically conductive and can serve as a first electrical contact for contacting the button cell. Secondly, the latching arms with the required spring force can be produced in a very simple manner. A spring force of the latching arms can be set by a width of the sheet-metal strips, which form the latching arms, and of course also by means of the selection of material for the sheet metal. The entire holder can be produced as a stamped and bent sheet-metal part in a cost-effective manner and in very large numbers.

In a development of the invention, at least one of the latching lugs is formed by means of a holding section arranged parallel in relation to the printed circuit board at least in sections and/or inclined in relation to the printed circuit board at least in sections.

As a result, the holding section forms an undercut behind which the button cell snaps when it is inserted into the holder. If the latching arm is designed as a sheet-metal strip, the holding section and therefore the latching lug can be produced by simply folding the sheet metal strip.

In a development of the invention, each latching arm has a connecting section which is connected to the main body at one end and to the holding section at the other end, and the holding section is connected to an insertion section on a side opposite the connecting section, which insertion section is arranged inclined in relation to the printed circuit board at least in sections when the holder is in the mounted state.

As a result, the insertion section extends, starting from the holding section, in an inclined manner away from a central point of the holder or the button cell and as a result can serve as an insertion bevel for the button cell. When the button cell runs onto the insertion bevel, the latching arm is deflected radially outwards as a result. As soon as the button cell has been pushed far enough into the holder and has left the insertion bevel, the latching arm will snap back, so that the holding section can engage over a top side of the button cell at least in sections and hold the button cell securely on the printed circuit board as a result.

In a development of the invention, the holder has at least two insertion arms which protrude from the printed circuit board when the holder is in the mounted state, wherein the button cell is received between the insertion arms when the button cell is in the mounted state, and wherein the insertion arms, at a first end, are connected to the main body, and wherein a second end of the insertion arms, which second end is situated opposite the first end, is further away from the base area of the main body than the first and second latching lugs.

The button cell, when it is inserted to the holder by means of a movement perpendicular to the printed circuit board towards the printed circuit board, consequently initially runs onto the insertion arms. The insertion arms can be provided with insertion bevels which automatically correctly position the button cell. For example, three to six insertion arms, each with an insertion bevel, are provided. The button cell is exactly centred in the radial direction with respect to the holder by means of said insertion arms and insertion bevels. The insertion arms centre the button cell, so that as the button cell is further advanced in the direction of the printed circuit board, the button cell can deflect the first latching arms and/or the second latching arms without problems until the button cell has reached its final position and the latching arms snap back into the holding position.

In a development of the invention, the main body has a bent shape and surrounds an edge of the button cell at least in sections when the holder and the button cell are in the mounted state.

In a development of the invention, the main body is of ring-like or ring segment-like design.

In a development of the invention, the base area of the main body has at least two fastening sections which rest on the printed circuit board when the holder is in the mounted state.

By means of such fastening sections, the holder can be placed onto appropriate soldering areas on the printed circuit board and soldered to the soldering areas in a simple manner. As a result, the holder can be automatically mounted and fixed with high process reliability.

In a development of the invention, at least one of the fastening sections is designed as a suction area for a vacuum-type gripper.

For example, one of the fastening sections is comparatively large and, in the mounted state, arranged parallel in relation to a top side of the printed circuit board. The holder can engage on this fastening section, for example by means of a vacuum-type gripper, and then be fully automatically placed onto the top side of the printed circuit board and fastened, for example soldered, on the top side. As a result, the holder can be fully automatically mounted on a printed circuit board.

In a development of the invention, three first latching arms, three second latching arms and at least three insert arms, in particular six insertion arms, are connected to the main body.

By means of three latching arms which are preferably distributed at a distance of 120° in relation to one another over the circumference of the main body of the holder, a button cell can be securely held between the first latching arms and/or the second latching arms. The angle between the respective latching arms can be exactly 120° here, but can also differ from this angle value if, for example, the spatial conditions require it.

The insertion arms can be provided adjacent to the latching arms on the circumference of the main body. For example, as seen along the circumference, in each case a first latching arm and a second latching arm are arranged between two insertion arms. This ensures that, when a button cell is inserted into the holder, the lower edge of the button cell is oriented precisely with respect to the respective first latching arms and second latching arms, before the lower edge runs onto the first or second latching arms.

The invention also relates to an arrangement comprising a holder according to the invention and a printed circuit board, wherein the holder is fastened on the printed circuit board such that the at least two first latching lugs are arranged at a first height above the printed circuit board. Consequently, the first latching arms with the first latching lugs are intended to hold a button cell with a first height on the printed circuit board.

In a development of the invention, the second latching lugs are arranged at a second height, which is different from the first height, above the printed circuit board.

Consequently, the second latching arms and the second latching lugs are intended to hold a button cell with a second height on the printed circuit board.

In a development of the invention, the at least two insertion arms protrude beyond the first latching arms and/or the second latching arms as seen from the printed circuit board.

Therefore, when a button cell is inserted into the holder, it initially makes contact with the insertion arms and can be oriented in a direction parallel in relation to the printed circuit board by said insertion arms. When the lower edge of the button cell then meets the first latching arms and/or the second latching arms, the button cell is exactly oriented, that is to say centred with respect to the holder, so that the first latching lugs and/or the second latching lugs can be pushed radially outwards, until the button cell is advanced so far in the direction of the printed circuit board that the first latching lugs and/or the second latching lugs snap back and engage over the top side of the button cell in sections.

In a development of the invention, at least one section of the holder forms a first electrical contact for contacting a button cell arranged in the holder, and at least one second electrical contact for contacting the button cell arranged in the holder is arranged on the printed circuit board, wherein the second electrical contact has at least one circular ring segment-like or circular ring-like contact area.

The bottom side of a button cell can be particularly securely contacted by means of a circular ring-like or circular ring segment-like contact area. It can often be observed that the bottom sides of button cells are not exactly flat, but rather are usually even slightly convexly shaped. By means of a circular ring segment like or circular ring-like contact area, such tolerances or deviations in shape can be compensated for without problems and secure electrical contacting can be ensured. Within the scope of the invention, the bottom side of the button cell can also be contacted by way of a contact of any desired shape.

In a development of the invention, an outer border of the contact area is at a distance of only around ½₀ to ⅕ of the radius of the button cell, in particular ½₀ to ⅒ of the radius of the button cell, from the first and/or the second latching arm, as seen in the radial direction and parallel in relation to the printed circuit board.

At the edge of the button cell, the metal button cell is particularly stable owing to the border between the edge and the bottom side and usually also has only small tolerances in this region, at least in comparison to the centre of the bottom side of the button cell. As a result, the button cell can be reliably electrically contacted only at a short distance from the outer edge of said button cell.

As a button cell is automatically inserted into an arrangement according to the invention, the button cell is oriented by means of a gripper or manipulator in such a way that a bottom side of the button cell is oriented parallel in relation to the top side of the printed circuit board and the button cell is arranged above the holder. Following the orientation of the button cell, the button cell is advanced perpendicularly in relation to the top side of the printed circuit board towards the printed circuit board, until a lower circumferential edge of the button cell makes contact, with the respectively upper ends of the first and/or the second latching arms. The button cell is then further advanced perpendicularly in relation to the printed circuit board towards the printed circuit board in order to deflect the first and/or the second latching arms in the radial direction. The button cell is then further advanced perpendicularly in relation to the printed circuit board towards the printed circuit board, until the latching lugs on the first and/or second latching arms snap back in the radial direction and engage over a top side of the button cell in sections.

Consequently, the holder according to the invention can be fully automatically loaded with a button cell in a very simple manner. Insertion arms which may be provided on the holder according to the invention can radially orient the button cell, that is to say orient said button cell parallel in relation to the top side of the printed circuit board, before the button cell meets the latching arms, so that the button cell meets the latching arms in the exactly prescribed position and can reliably deflect said latching arms in the radial direction as a result. The holder can also be manually loaded with a button cell in a very simple and rapid manner.

A method according to the invention for automatically mounting a holder on a printed circuit board, wherein the holder has at least one fastening section on which a gripper can engage, comprises the steps of grasping the holder by means of the gripper engaging on the fastening section, positioning the holder relative to connection areas on the printed circuit board and placing the holder onto the printed circuit board.

Owing to the provision of at least one fastening section which is arranged, in particular, parallel in relation to the printed circuit hoard in the mounted state, the holder can be grasped, positioned and then placed onto the printed circuit board in a very simple manner by means of a vacuum-type gripper, for example. The fastening section or a plurality of fastening sections can be designed such that the respective bottom sides of the fastening sections can then also be used as electrical contact areas for appropriate connection areas on the printed circuit board.

The method according to the invention can include the step of soldering the holder to at least one connection area on the printed circuit board. As a result, firstly secure mechanical fastening and secondly electrical connection between the connection areas of the printed circuit board and the holder are achieved by simple soldering. However, it is also entirely possible within the scope of the invention to mechanically fasten the holder to the printed circuit board and to then provide the electrical contacting separately, for example by means of wires or the like.

Further features and advantages of the invention can be gathered from the claims and the following description of a preferred embodiment of the invention in conjunction with the drawings. Individual features of the embodiments shown in the drawings can be combined with one another in any desired manner here without departing from the scope of the invention. This also applies to the combination of individual features without further individual features with which they are described and/or shown together.

DETAILED DESCRIPTION

Figure 1:
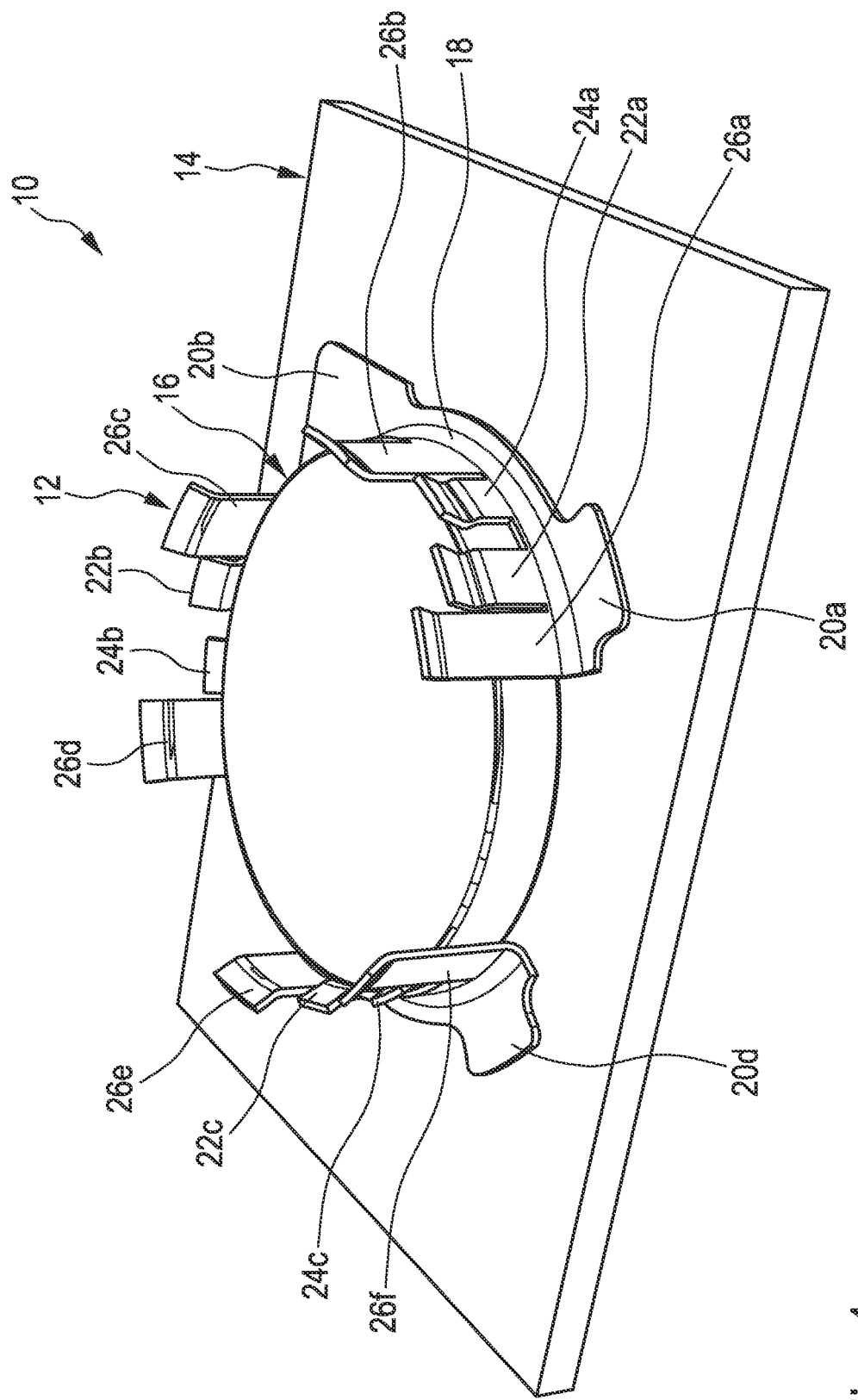
FIG. 1 shows an oblique top view of an arrangement according to the invention comprising a holder which is arranged on a printed circuit board and comprising a first button cell which is inserted into the holder.

FIG. 1 shows an arrangement 10 according to the invention obliquely from above. The arrangement 10 has a holder 12 which is placed onto the top side of a printed circuit board 14. The holder 12 is electrically connected to soldering areas and conductor tracks, not illustrated, on the top side of the printed circuit board 14. As a result, the holder 12 is fixedly and immovably fastened on the top side of the printed circuit board 14.

A first button cell 16 is inserted into the holder 12. The button cell is a CR2032-type button cell and has a diameter of 20 mm and a height of 3.2 mm.

The holder 12 is of electrically conductive design in the form of a one-piece stamped and bent sheet-metal part. The holder has a circular ring segment-like main body 18 which is provided with a total of four fastening sections 20a, 20b, 20c and 20d, wherein the fastening section 20c is concealed by the button cell 16 in the illustration of FIG. 1. The fastening section 20b is so large that it can serve as a suction area for a suction gripper. For the purpose of mounting the holder 12 on the top side of the printed circuit board 14, the holder 12 can therefore be grasped by means of a vacuum-type gripper at the fastening section 20b and set down in the desired position on the top side of the printed circuit board 14. In this desired position, the holder 12 is then held by means of the vacuum-type gripper while the fastening sections 20a, 20b, 20c and 20d are soldered to fastening areas, not illustrated, on the printed circuit board 14. The fastening areas on the printed circuit board 14 are, for their part, connected to conductor tracks, not illustrated, on the printed circuit board 14. As a result, the holder 12 can be fully automatically fastened on the printed circuit board 14 and at the same time electrically contacted in a rapid manner with process reliability.

The holder 12 is provided with three first latching arms 22a, 22b and 22c which, as will be explained further below, each have a first latching lug, wherein each first latching lug engages over a top side of the button cell 16 in sections and as a result securely holds the button cell 16 on the printed circuit board 14. The latching arms 22a are each connected at one end to the main body 18 and protrude perpendicularly in relation to the top side of the printed circuit board 14 from the main body 18. The first latching arms 22a, 22b, 22c are at a distance of approximately 120° from one another as seen over the circumference of the holder 12. Just two first latching arms or else more than three latching arms can also be provided within the scope of the invention. The angle by which the first latching arms are at a distance from one another can also be varied when there are three latching arms.

The holder 12 further has three second latching arms 24a, 24b, 24c. The second latching arms 24a, 24b, 24c are also connected at one end to the main body 18 and protrude perpendicularly from the top side of the printed circuit board 14. The second latching arms 24a, 24b, 24c are each provided with a second latching lug which, however, in the state of FIG. 1 bears against an outer edge of the button cell 16. As will be explained further below, the second latching arms 24a, 24b, 24c are intended to hold a second button cell with a height that is lower than that of the button cell 16, for example a button cell of the CR2025 type. In the button cell 16 according to FIG. 1, the latching lugs of the second latching arms 24a, 24b, 24c bear against the outer edge of the first button cell 16 and contribute to providing good electrical contact between the edge of the button cell 16 and the holder 12. Within the scope of the invention, the second latching arms 24a, 24b, 24c can also be designed such that, when two button cells of the same size or of different sizes, for example two CR2025 button cells, are arranged one above the other, they hold the upper button cell.

The holder 12 furthermore has a total of six insertion arms 26a to 26f. The insertion arms 26a to 26f protrude beyond the first latching arms and the second latching arms, as seen from the printed circuit board 14. At their upper end in FIG. 14, which is therefore furthest away from the printed circuit board 14, the insertion arms 26a to 26f are each provided with an insertion section in the form of a run-on bevel. This run-on bevel is arranged in a manner inclined radially outwards, wherein the latching arms 26a to 26f moreover protrude perpendicularly from the top side of the printed circuit board 14 and are connected to the main body 18. Within the scope of the invention, the insertion arms can also be dispensed with or a different number of insertion arms can be provided.

If the button cell 16 in FIG. 1 is moved from the top perpendicularly in relation to the printed circuit board 14 and towards the printed circuit board 14, a lower edge of the button cell 16 initially makes contact with the run-on bevels at the upper end in FIG. 1 of the insertion arms 26a. The run-on bevels on the insertion arms 26a to 26f then ensure that the button cell is oriented exactly centrally with respect to the holder 12 in the radial direction, in other words is centred relative to the holder 12. If the button cell 16 is then advanced further in the direction of the printed circuit board 14, the first latching arms 22a to 22c and then the second latching arms 24a to 24c are reliably deflected in the radial direction as a result. The button cell 16 is advanced in the direction of the printed circuit board 14 unit a bottom side of the button cell 16 in FIG. 1 makes contact with second contacts, not visible, on the top side of the printed circuit board 14 and the first latching arms 22a to 22c again snap radially inwards, so that the first latching lugs on the first latching arms 22a, 22b, 22c engage over the top side of the button cell 16 in sections and securely hold the button cell 16 on the printed circuit board 14 as a result.

Figure 2:
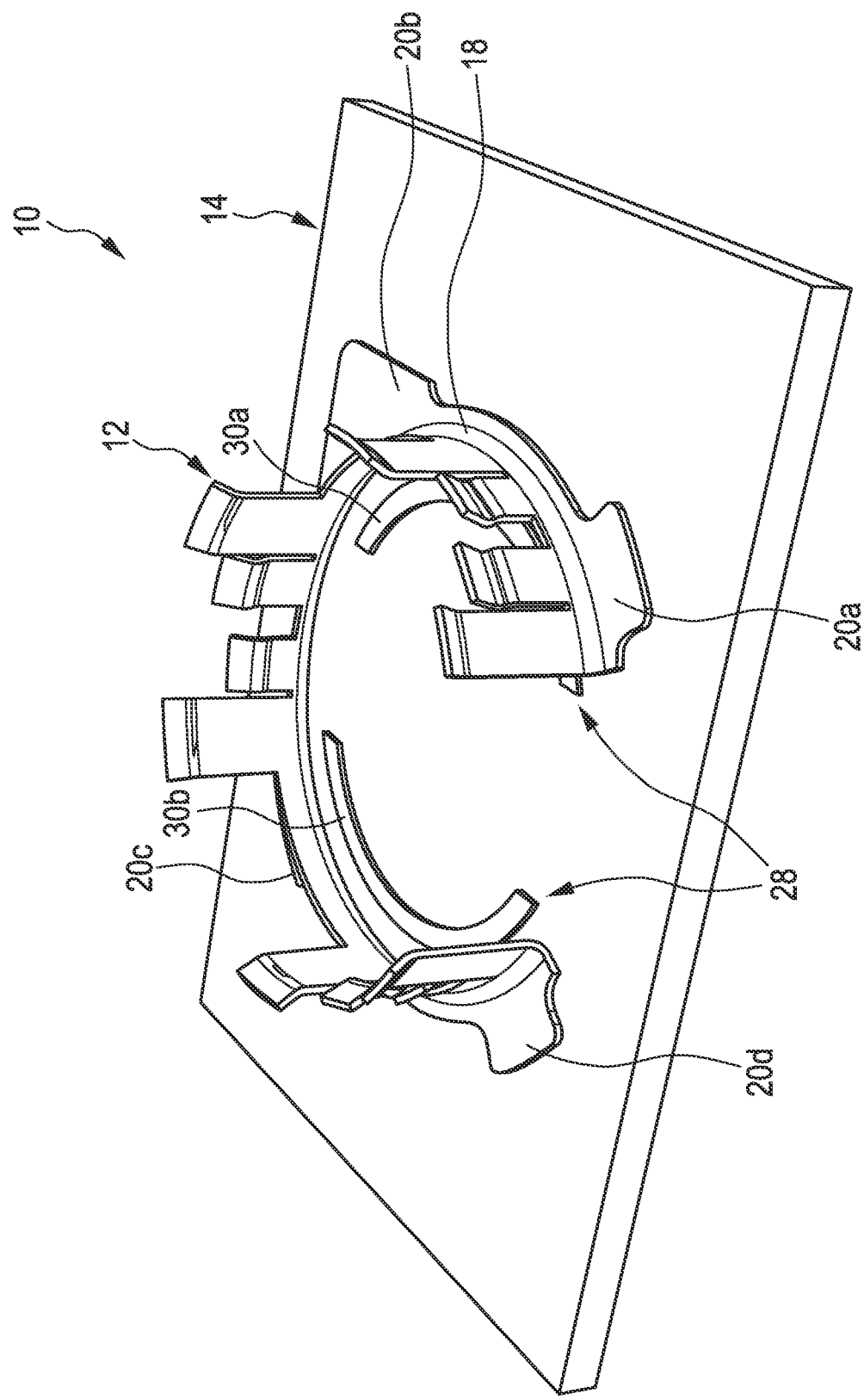
FIG. 2 shows the arrangement of FIG. 1 without the button cell.

FIG. 2 shows the arrangement 10 of FIG. 1 without the button cell 16. In the first instance, it can be seen that a second electrical contact 28, which is provided for electrically contacting the bottom side of the button cell 16, is formed on the top side of the printed circuit board 14 within the holder 12. This is usually the earth contact. The second contact 28 has two circular ring segment-like contact areas 30a, 30b which are arranged opposite one another. An outer edge of the contact areas 30a, 30b is arranged parallel in relation to the main body 18 of the holder 12 in each case. The outer edge of the contact areas 30a, 30b is arranged at a comparatively small distance from the inner circumference of the main body 18. The distance is approximately 1/10 of the radius of the holder 12. The distance can lie between 1/5 and 1/20 of the radius of the holder 12. As a result, the contact areas 30a, 30b contact the bottom side of the button cell 16 only slightly within their outer edge. In this region, the button cell 16 is comparatively dimensionally stable and also has only small tolerances with respect to its dimensions. The provision of circular ring segment-like contact areas 30*a*, 30*b* or else only a circular ring-like contact area ensures reliable contacting of the button cell 16 as a result. Owing to the shape of the contact areas 30*a*, 30*b*, the risk of short circuits during mounting of button cells is also minimized. The contact areas 30*a*, 30*b* are connected to conductor tracks, not illustrated, on the top side of the printed circuit board 14 in order to supply the battery voltage of the button cell 16 to a circuit, not illustrated, on the printed circuit board 14. Within the scope of the invention, the earth contact can also be designed with any desired shape.

Figure 3:
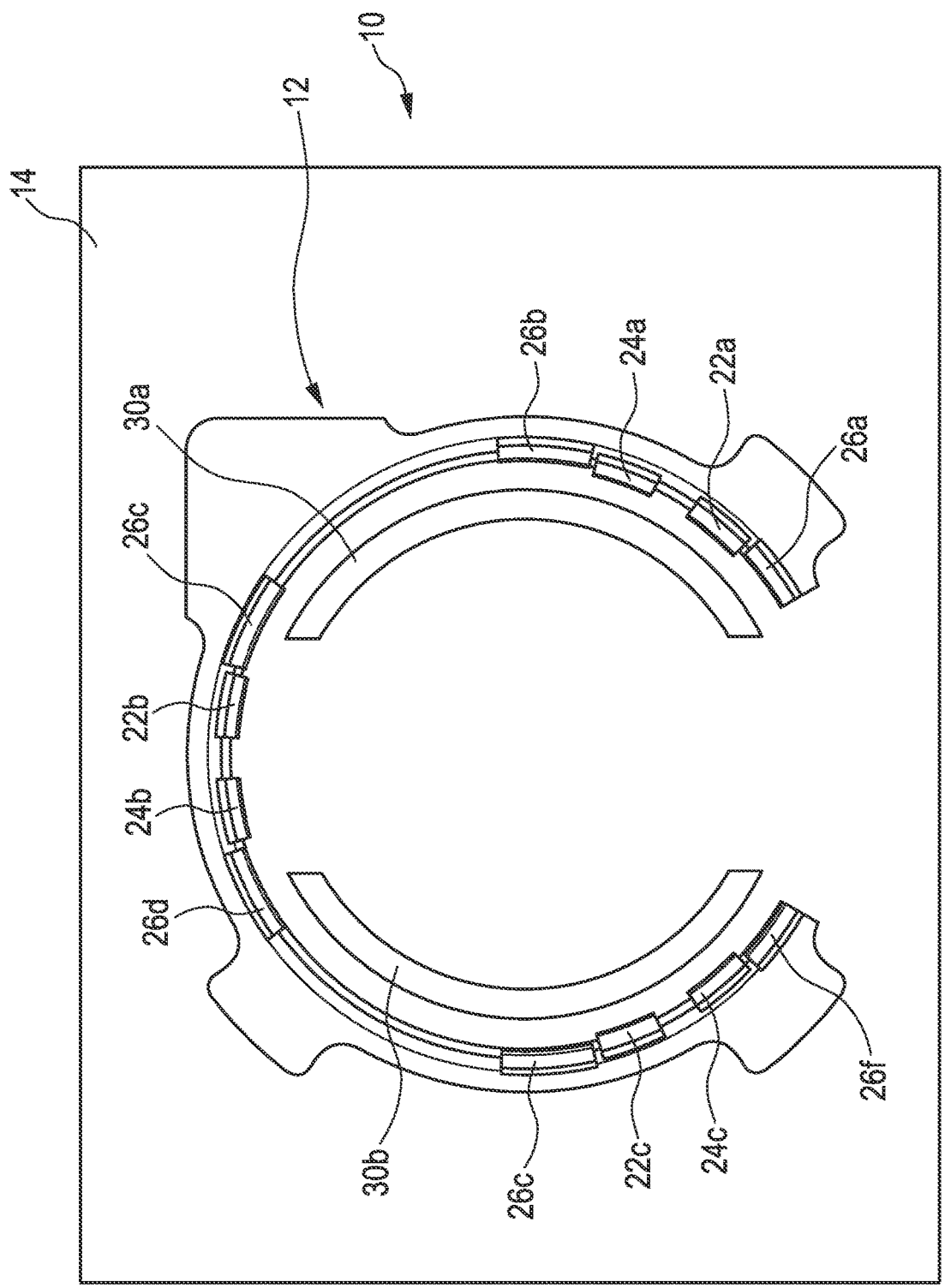
FIG. 3 shows a top view of the arrangement of FIG. 2.

FIG. 3 shows the arrangement 10 of FIG. 2 from above. It can be seen in FIG. 3 that the first latching arms 22*a*, 22*b* and 22*c* are respectively at a distance of approximately 120° from one another. The second latching arms 24*a*, 24*b*, 24*c* are also respectively at a distance of approximately 120° from one another.

In each case two latching arms 22*a*, 24*a*, 22*b*, 24*b* and 22*c*, 24*c* are respectively surrounded by two insertion arms 26*a* to 26*f*, as seen in the circumferential direction of the holder 12. It can also be seen in the view of FIG. 3 that the first latching arms 22*a* and the second latching arms 24*a*, by way of their latching lugs, each protrude further in the direction of an imaginary centre point of the holder 12 than the insertion arms 26*a* to 26*f*. As a result, the latching lugs on the latching arms 22*a* to 22*c* and 24*a* to 24*c* can engage over the top side of the button cell 16 in sections and as a result hold it on the top side of the printed circuit board 14 and especially on the contact areas 30*a*, 30*b* on the printed circuit board 14.

Figure 4:
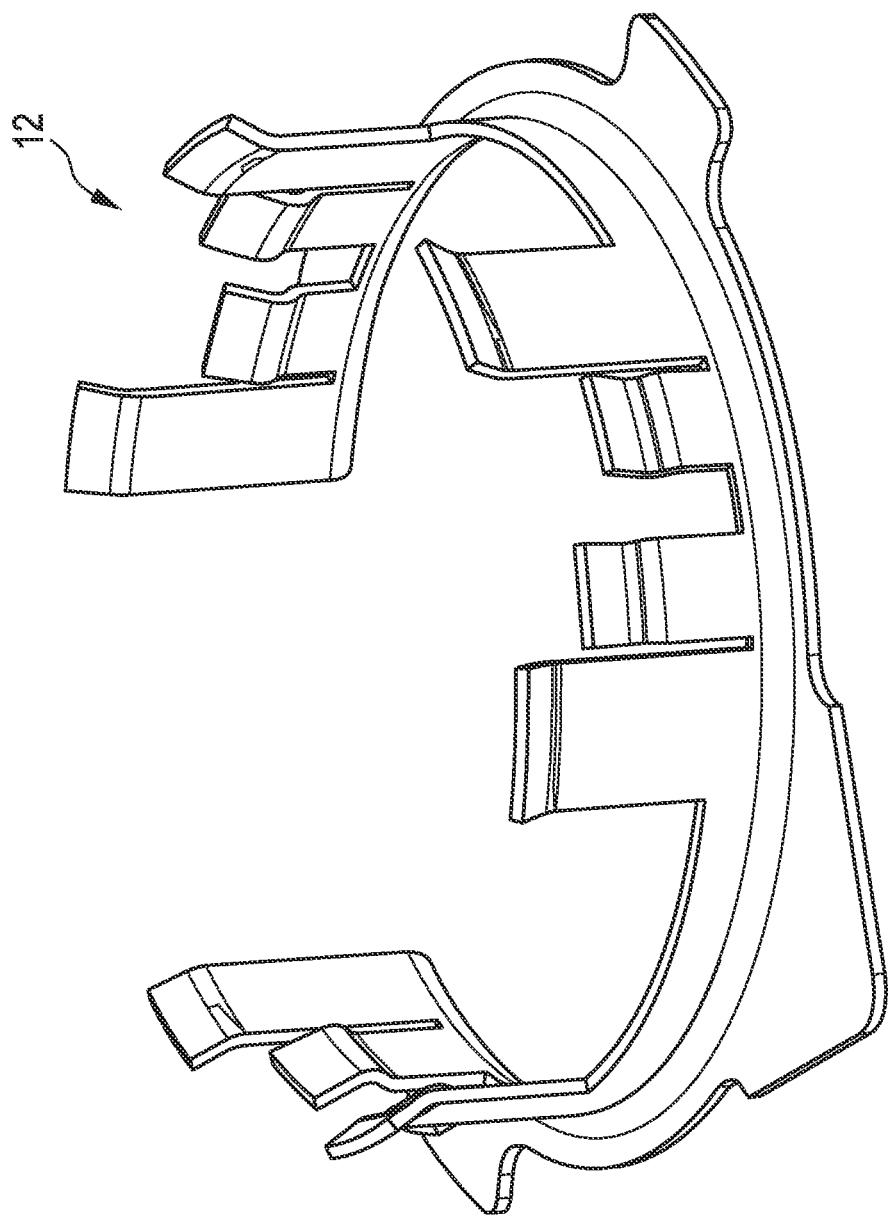
FIG. 4 shows an oblique top view of the holder according to the invention.

FIG. 4 shows an oblique top view of the holder 12.

Figure 5:
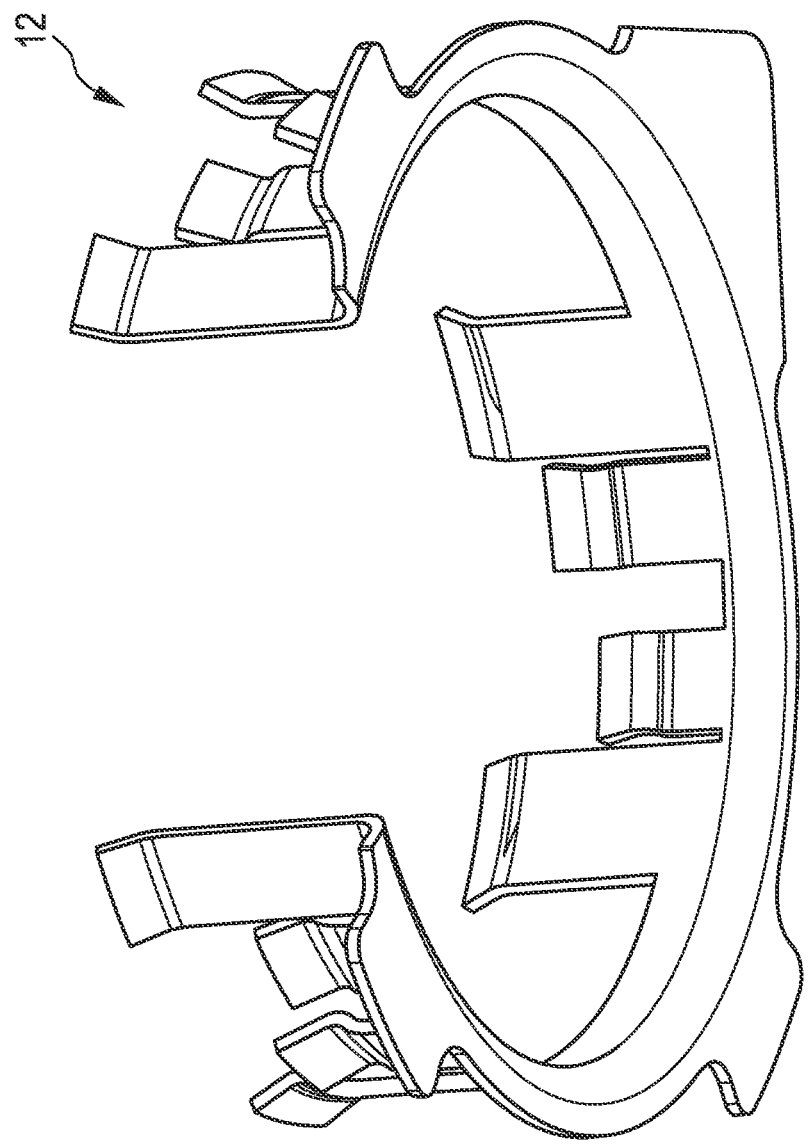
FIG. 5 shows an oblique bottom view of the holder of FIG. 4.

FIG. 5 shows an oblique bottom view of the holder 12.

Figure 6:
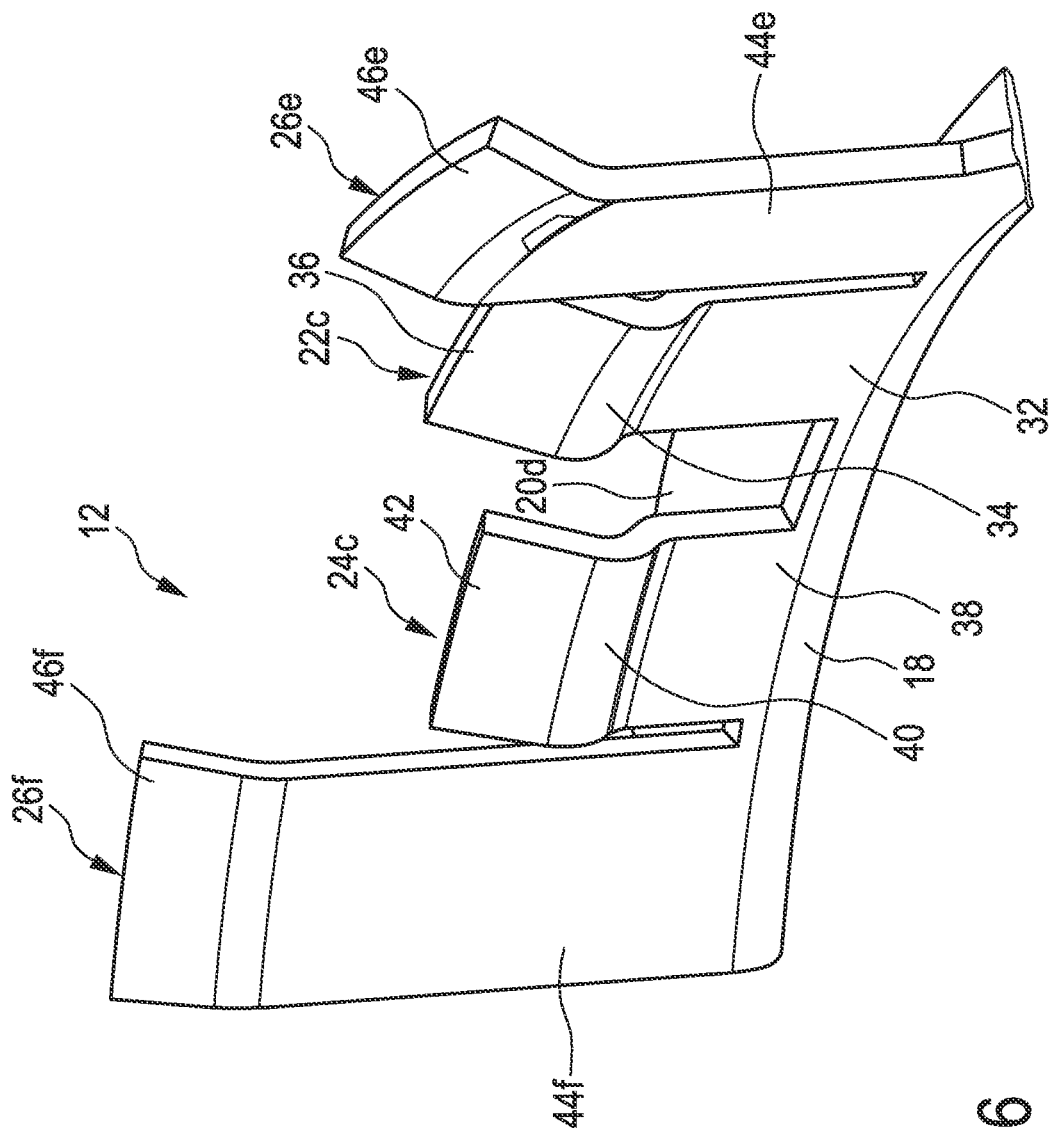
FIG. 6 shows an enlarged detail of the holder of FIGS. 4 and 5.

FIG. 6 shows an enlarged illustration of a section of the holder 12, where just two insertion arms 26*a* and 26*f* and the first latching arm 22*c* and the second latching arm 24*c* and a section of the fastening area 20*d* can be seen.

All of the insertion arms 26*a* to 26*f*, all of the first latching arms 22*a* to 22*c* and all of the second latching arms 24*a* to 24*c*, at one end, are connected to the main body 13 of the holder 12. Starting from the main body 18, all of the first latching arms 22*c*, where only the latching arm 22*c* is illustrated in FIG. 6, have a connecting section 32 which is designed as a sheet-metal strip running in a straight line. The connecting section then merges with a holding section 34 which extends in a manner inclined inwards. When the holder 12 is in the state mounted on the printed circuit board 14, the holding section 34 extends in an inclined manner in relation to the printed circuit board 14. As can be seen in FIG. 6, the holding section extends in an inclined manner in relation to the connecting section 32 and in the direction of an interior of the holder 12, wherein the button cell 16 is then inserted into this interior. The holding section 34 forms a latching lug which, when the button cell 16 is in the fully inserted state, snaps over the top side of the button cell 16 in sections, cf. FIG. 1.

On a side of the holding section 34 that is opposite the connecting section 32, said holding section merges with an insertion section 36 which is likewise arranged in ah inclined manner in relation to the connecting section 32, but extends in an inclined manner away from the interior of the holder 12. The insertion section 36 forms a run-on bevel for the lower edge of the button cell 16 when said button cell is inserted into the holder 12. When the lower edge of the button cell 16 runs onto the insertion section 36, the latching arm 22*c* is deflected radially outwards, that is to say to the right in FIG. 6, as a result. The edge of the button cell can, as a result, slide past the section of the holding section 34 that is situated furthest on the inside or the section of the latching lug that is situated furthest on the inside, until the latching lug or the holding section 34 can again move in the direction of the interior of the holder 12. In other words, the latching arm 22*c* then springs back, so that the holding section 34 can engage over the top side of the button cell 16 in sections.

The second latching arm 24*c* and all of the further second latching arms 24*a* to 24*c* are constructed in the same way as the first latching arms 22*a* to 22*c*, except that the second latching lug or the second holding section 40 is less far away from the main body 18 than the holding section 34 on the first latching arm 22*c*. This is achieved by way of the connecting section 38 of the second latching arm 24*c* being shorter than the connecting section 32 of the first latching arm 22*c*. As a button cell is inserted, the lower edge of the button cell 16 will meet the insertion section 42 of the second latching arm 24*c* and deflect the second latching arm 24*c* radially outwards, that is to say to the top right in FIG. 6, as a result. The bottom edge of the button cell can, as a result, slide past thy latching lug or the holding section 40 of the second latching arm 24*c*. However, with the button cell 16 inserted, cf. FIG. 1, the second latching arm 24*c* remains in the state in which it is deflected radially outwards and the latching lug 40 bears against the outer edge of the button cell 16. The second latching arms 24*a*, 24*b*, 24*c* can spring back again if a button cell 50 with a lower height than the button cell 16 is inserted, also see FIG. 9.

The insertion arms 26*e*, 26*f* each have a connecting section 44*e*, 44*f* which are each connected to the main body 18 and protrude upwards perpendicularly in relation to the printed circuit board 14, cf. FIG. 1. The connecting sections 44*e*, 44*f* of the insertion arms 26*e*, 26*f*, at their end that is averted from the main body 18, each merge with an insertion section 46*e*, 46*f*, wherein the insertion sections 46*e*, 46*f* extend away from the interior of the holder 12 in a manner inclined upwards and as a result each form a run-on bevel.

If the button cell 16 is moved in the direction of the holder 12, the lower edge of the button cell 16 initially makes contact with the insertion sections 46*e*, 46*f* of the insertion arms 26*a* to 26*f*. These act as run-on bevels and ensure that the button cell is oriented exactly centrally with respect to the holder 12 by way of the button cell 16 being displaced possibly parallel in relation to the printed circuit board relative to the gripper or together with the gripper. In this state, the outer edge of the button cell 16 is then at a slight distance from an inner side of the insertion arms 26*a* to 26*f* or bears against the inner side of the insertion arms 26*a* to 26*f* without preloading. The connecting sections 44*e*, 44*f* of the insertion arms 26*a* to 26*f* then ensure that, as the button cell 16 is advanced further in the direction of the printed circuit board 14, the button cell retains its radial position with respect to the holder 12 and then exactly meets the insertion sections 36, 42 of the first latching arms 22*a* to 22*c* or of the second latching arms 24*a* to 24*c* and can then deflect them outward in the radial direction.

Figure 7:
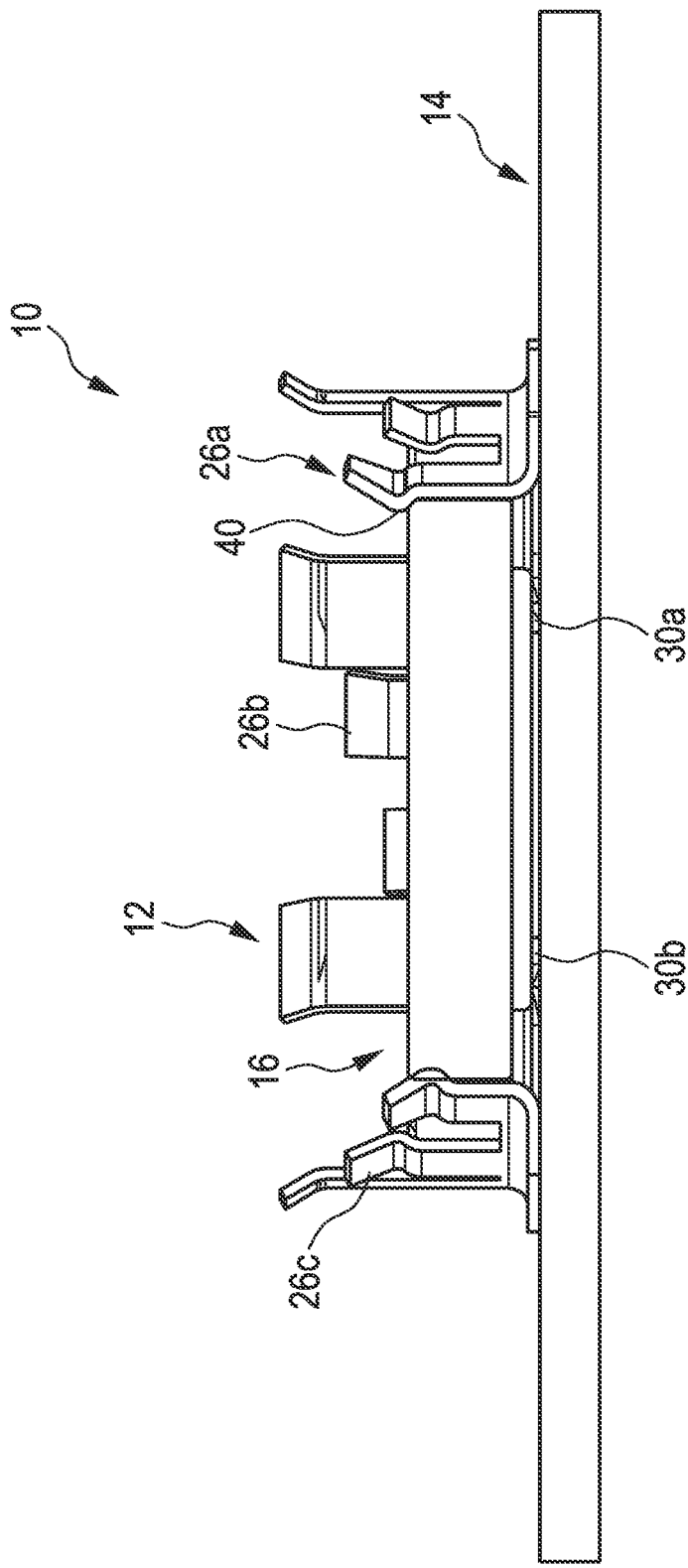
FIG. 7 shows a sectional view through the arrangement of FIG. 1.

FIG. 7 shows a sectional view through the arrangement 10 of FIG. 1, wherein the position of the section plane has been selected such that it passes through the first latching arm 26*a*.

Figure 8:
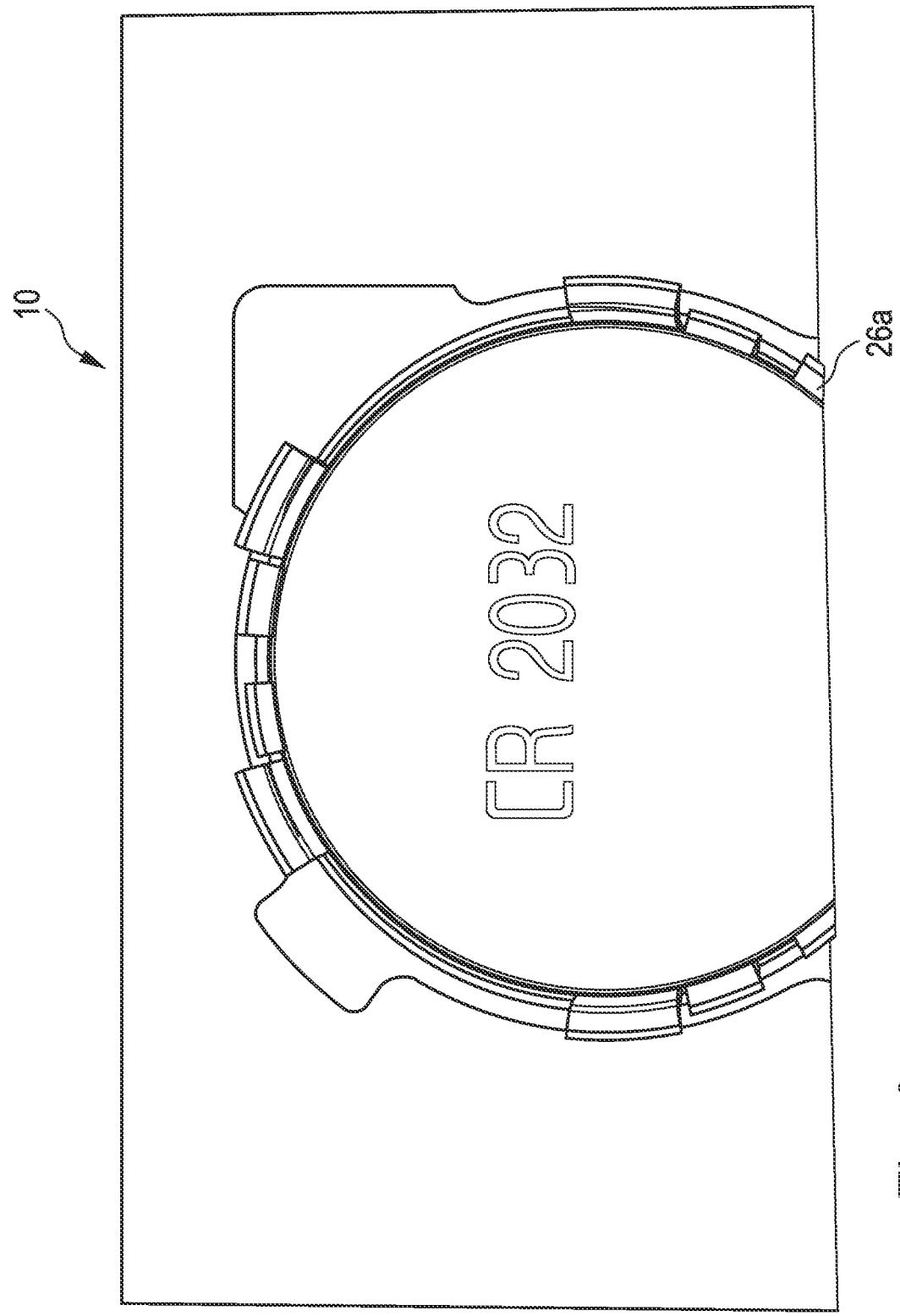
FIG. 8 shows a view of the arrangement sectioned according to FIG. 7 from above for illustrating the position of the section plane.

The position of the section plane can be seen with reference to FIG. 8 which shows a plan view of the arrangement 10 sectioned according to FIG. 7.

It can be seen in FIG. 7 that the latching lug 40 of the first latching arm 26*a* engages over a top side of the button cell 16 in sections and holds the button cell 16 on the printed circuit board 14 as a result. In FIG. 7, the button cell 16 consequently cannot be readily moved upwards away from the printed circuit board 14. For this purpose, the button cell would have to be levered out of the holder 12 in order to overcome the preloading force of the first latching arms 26a to 26c.

A bottom side of the button cell 16, as can likewise be seen in FIG. 7, is pushed against the circular ring segment-like contact areas 30a, 30b on the printed circuit board 14.

Figure 9:
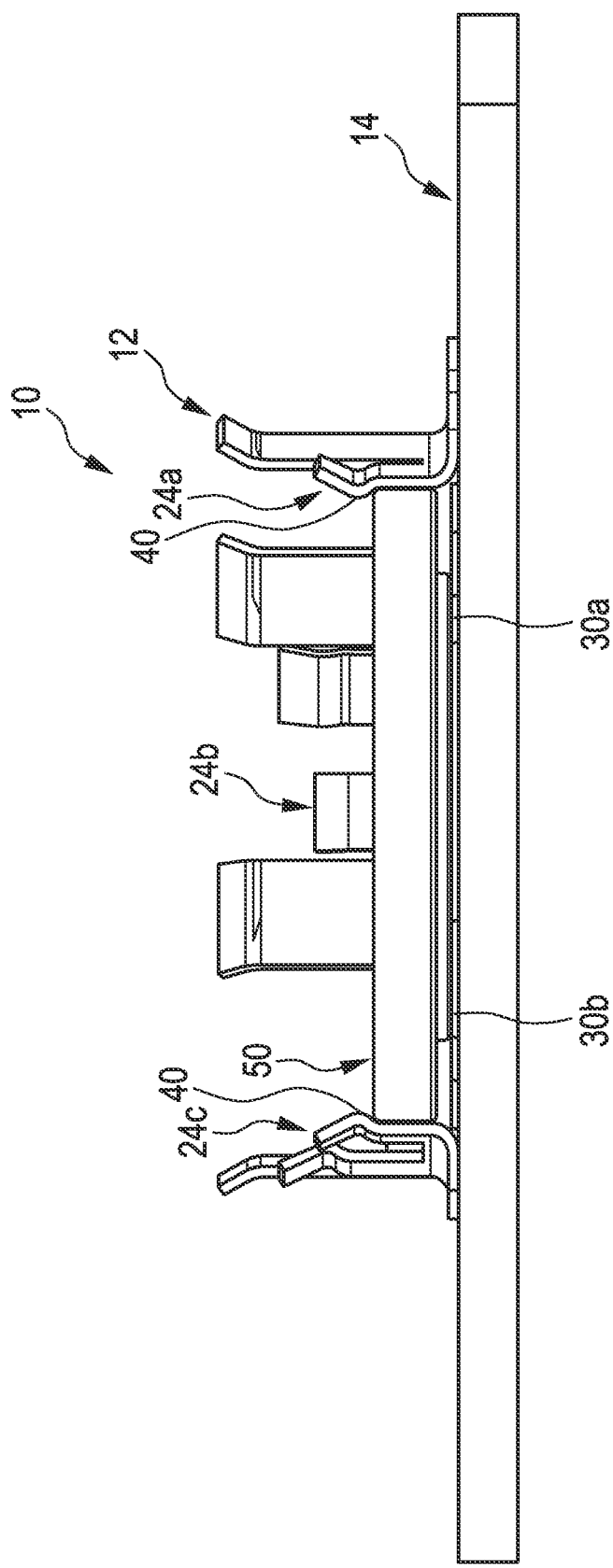
FIG. 9 shows a sectioned view through the arrangement according to the invention, where a second button cell with a lower height than in the illustration of FIG. 7 is inserted into the holder.

FIG. 9 shows a further sectional view through the arrangement 10 according to the invention, wherein a second button cell 50 with a lower height than the first button cell 16 has been inserted into the holder 12. Specifically, the second button cell 50 is a CR2025-type button cell. The button cell 50 therefore has a diameter of 20 mm and a height of 2.5 mm.

Figure 10:
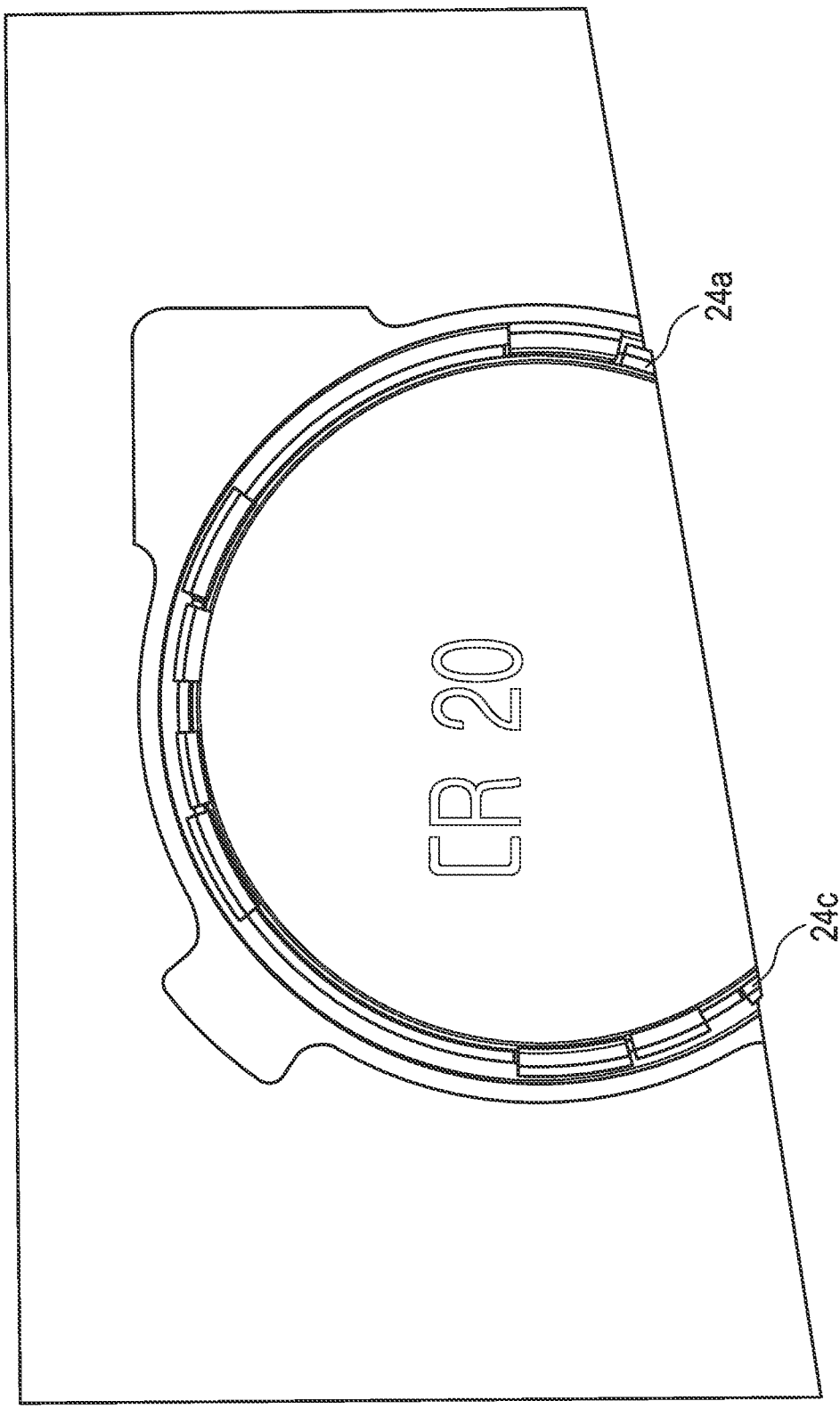
FIG. 10 shows a view of the sectioned arrangement of FIG. 9 from above for illustrating the position of the section plane.

The section plane in FIG. 9 has been placed, see FIG. 10, such that the section plane passes through two second latching arms 24a and 24c. It can be seen in FIG. 9 that the latching lugs 40 of the second latching arms 24a, 24c engage over the top side of the button cell 50 in sections and hold them in the holder 12 and pushed against the top side of the printed circuit board 14 as a result. The bottom side of the button cell 50 is pushed against the contact areas 30a, 30b on the top side of the printed circuit board 14 as a result.

Using the arrangement 10 according to the invention, it is possible as a result to contact button cells of different heights and to hold them on the printed circuit board 14. It is also possible to insert two or more button cells with different heights or the same height into the holder one above the other and to electrically contact said button cells.

Figure 11:
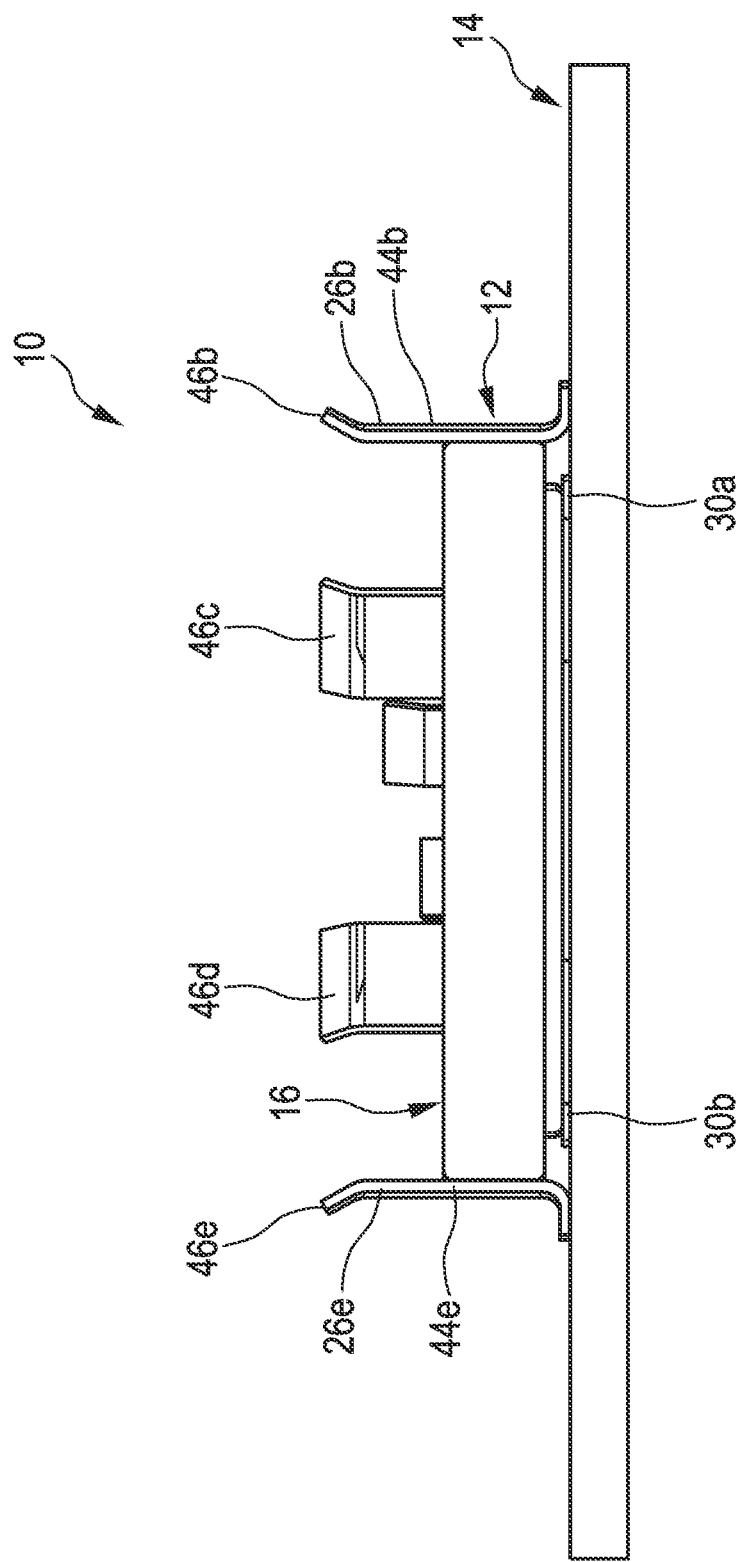
FIG. 11 shows a further sectioned view through the arrangement according to the invention, where the section plane in FIG. 11 runs through two mutually opposite insertion arms.

The illustration of FIG. 11 shows a further sectional view through the arrangement 10 of FIG. 1. However, the section plane has been selected in FIG. 11 such that it passes through two insertion arms 26b and 26e. It can be seen in this view that the outer edge of the button cell 16 is at a very small distance from the inner side of the insertion arms 26b, 26e or bears against the inner side of the insertion arms 26b, 26e without preloading. As has already been discussed, the insertion sections 46 of the insertion arms 26a to 26f ensure that the button cell 16 or the button cell 50 is oriented exactly with respect to the holder 12 in the radial direction, that is to say parallel in relation to the printed circuit board 14. The connecting sections 44 of the insertion arms 26a to 26f then ensure that the button cell is guided in the radial direction as it is advanced further in the direction towards the printed circuit board 14. This can ensure that the lower edge of the button cell makes contact with the insertion bevels of the latching arms, so that the latching arms are then deflected in the radial direction as the button cell is advanced further in the direction towards the printed circuit board 14.

The invention claimed is:

1. Holder for at least one button cell, wherein the holder is fastened on a printed circuit board, wherein the holder has at least two first latching arms which protrude from the printed circuit board when the holder is in a mounted state, wherein the button cell is received between the first latching arms when the button cell is in the mounted state, wherein the first latching arms, at one end, are each connected to a main body which has a base area which is connected to the printed circuit board when the holder is in the mounted state, wherein the first latching arms each have at least one first latching lug in order to hold the button cell on the printed circuit board, and wherein the first latching lugs are arranged at a first distance from the base area of the main body, wherein the holder has at least two second latching arms which protrude from the printed circuit board when the holder is in the mounted state, wherein the button cell is received between the second latching arms when the button cell is in the mounted state, wherein the second latching arms, at one end, are each connected to the main body, wherein the second latching arms each have at least one second latching lug in order to hold a button cell with a different height from the first button cell or a further button cell on the printed circuit board, and wherein the second latching lugs are arranged at a second distance from the base area of the main body, wherein the second distance is different from the first distance.

2. Holder according to claim 1, wherein the latching arms and the main body are of electrically conductive design.

3. Holder according to claim 1, wherein the latching arms are designed as bent sheet-metal strips.

4. Holder according to claim 1, wherein the holder is designed as a one-piece stamped and bent sheet-metal part.

5. Holder according to claim 1, wherein at least one of the latching lugs is formed by means of a holding section arranged parallel in relation to the printed circuit board at least in sections and/or inclined in relation to the printed circuit board at least in sections.

6. Holder according to claim 5, wherein each latching arm has a connecting section which is connected to the main body at one end and to the holding section at the other end, and in that the holding section is connected to an insertion section on a side opposite the connecting section, which insertion section is arranged inclined in relation to the printed circuit board, to the connecting section and/or to the main body at least in sections when the holder is in the mounted state.

7. Holder according to claim 1, wherein the holder has at least two insertion arms which protrude from the printed circuit board when the holder is in the mounted state, wherein the button cell is received between the insertion arms when the button cell is in the mounted state, and wherein the insertion arms, at one end, are connected to the main body, and wherein a second end of the insertion arms, which second end is situated opposite the first end, is further away from the base area of the main body than the first and second latching lugs.

8. Holder according to claim 1, wherein the main body has a bent shape and surrounds an edge of the button cell at least in sections when the holder and the button cell are in the mounted state.

9. Holder according to claim 8, wherein the main body is of ring-like or ring segment-like design.

10. Holder according to claim 1, wherein the base area of the main body has at least two fastening sections which rest on the printed circuit board when the holder is in the mounted state.

11. Holder according to claim 10, wherein at least one of the fastening sections is designed as a suction area for a vacuum-type gripper.

12. Holder according to claim 1, wherein three first latching arms, three second latching arms and/or at least three insertion arms are connected to the main body.

13. Arrangement comprising a holder according to claim 1 and a printed circuit board, wherein the holder is fastened on the printed circuit board such that the at least two first latching lugs are arranged at a first height above the printed circuit board, wherein the second latching lugs are arranged at a second height, which is different from the first height, above the printed circuit board.

14. Arrangement according to claim 13, wherein the at least two insertion arms protrude beyond the first latching arms and/or the second latching arms as seen from the printed circuit board.

15. Arrangement according to claim 13, wherein at least one section of the holder forms a first electrical contact for contacting a button cell arranged in the holder, and in that at least one second electrical contact for contacting the button cell arranged in the holder is arranged on the printed circuit board, wherein the second electrical contact has at least one circular ring segment-like or circular ring-like contact area.

16. Arrangement according to claim 15, wherein an outer border of the contact area is at a distance of $\frac{1}{20}$ to $\frac{1}{5}$ of the radius of the button cell from the first and/or the second latching arm, as seen in the radial direction and parallel in relation to the printed circuit board.

17. Method for automatically mounting a holder according to claim 1 on a printed circuit board, wherein the holder has at least one fastening section on which a gripper can engage, comprising the steps of grasping the holder by means of the gripper engaging on the fastening section, positioning the holder relative to connection areas on the printed circuit board and placing the holder onto the printed circuit board.

18. Method according to claim 17, comprising the step of soldering the holder to at least one connection area on the printed circuit board.

\* \* \* \* \*